(12) United States Patent
Hanabata

(10) Patent No.: US 6,653,043 B1
(45) Date of Patent: Nov. 25, 2003

(54) ACTIVE PARTICLE, PHOTOSENSITIVE RESIN COMPOSITION, AND PROCESS FOR FORMING PATTERN

(75) Inventor: Makoto Hanabata, Kyoto (JP)

(73) Assignee: Kansai Research Institute, Inc., Osaka (JP)

( * ) Notice: Subject to any disclaimer, the term of this patent is extended or adjusted under 35 U.S.C. 154(b) by 201 days.

(21) Appl. No.: 09/699,410

(22) Filed: Oct. 31, 2000

(30) Foreign Application Priority Data

Nov. 1, 1999 (JP) .......................................... 11-310980

(51) Int. Cl.⁷ ............................................... G03C 1/492
(52) U.S. Cl. .................... 430/270.1; 430/170; 430/171; 430/189
(58) Field of Search ............................ 430/270.1, 189, 430/496, 171

(56) References Cited

U.S. PATENT DOCUMENTS

| | | | |
|---|---|---|---|
| 4,336,319 A | | 6/1982 | Nagashima et al. |
| 4,377,555 A | * | 3/1983 | Hancock et al. ................ 423/6 |
| 4,559,271 A | * | 12/1985 | Doin et al. |
| 4,975,471 A | * | 12/1990 | Hayase et al. ................. 522/13 |
| 5,086,087 A | * | 2/1992 | Misev ......................... 522/84 |
| 5,264,319 A | | 11/1993 | Sugiyama et al. |
| 5,519,088 A | * | 5/1996 | Itoh et al. .................... 524/812 |
| 5,753,405 A | | 5/1998 | Elsaesser et al. |
| 5,766,821 A | * | 6/1998 | Muramatsu et al. ......... 430/264 |
| 6,066,432 A | * | 5/2000 | Yanaka ....................... 430/203 |
| 6,132,925 A | * | 10/2000 | Hoshi ......................... 430/203 |
| 6,183,935 B1 | * | 2/2001 | Hanabata et al. ......... 430/270.1 |

FOREIGN PATENT DOCUMENTS

| | | | | |
|---|---|---|---|---|
| EP | 346808 A2 | * | 6/1989 | ............. G03F/7/08 |
| EP | 1096313 A1 | * | 10/2000 | ........... G03F/7/004 |
| GB | 1 532 295 | | 11/1978 | |
| JP | 5-158235 | | 6/1993 | |
| JP | 11-194491 | | 7/1999 | |
| JP | 11327125 A | * | 11/1999 | ........... G03F/7/004 |
| JP | 2001194775 A | * | 7/2001 | ........... G03F/7/004 |
| WO | WO99/35536 | | 7/1999 | |

* cited by examiner

Primary Examiner—Janet Baxter
Assistant Examiner—Yvette C. Thornton
(74) Attorney, Agent, or Firm—Pillsbury Winthrop LLP

(57) ABSTRACT

Active particles which when incorporated into a photosensitive composition containing base resin and diazonium-series photosensitizer provide improvement in at least one or both of sensitivity and resolutionn. The active particles include a particulate carrier, such as silica sol, and an aromatic unit directly or indirectly bonded to the carrier. The aromatic unit has a phenolic hydroxyl group and no substituent in at least one of the o- and p-positions, in relation to the phenolic hydroxyl group. The active particles, when incorporated into the photosensitive composition can, after exposure, increase solubility difference between the exposed and non-exposed areas.

23 Claims, No Drawings

ACTIVE PARTICLE, PHOTOSENSITIVE RESIN COMPOSITION, AND PROCESS FOR FORMING PATTERN

FIELD OF THE INVENTION

The present invention relates to active particles that are useful for forming minute patterns such as semiconductor integrated circuits using, for example, ultraviolet rays or far-ultraviolet rays and used in combination with a photosensitizer; a photosensitive resin composition (resist composition) containing the same; and a process for forming a pattern using the composition.

BACKGROUND OF THE INVENTION

With rises in the integration level and performance of semiconductor integrated circuits, there has been the demand for resists with better resolution (patterns in submicron order, quartermicron order, or smaller). To meet such demand, improvement of resolution, as well as resists themselves, by employing dry developing has been proposed. For example, in the case where the wavelength of light is in the neighborhood of the resolution limit, it is proposed that, utilizing the fact that a silicon-containing resin is highly resistant to oxygen plasma, the resolution is improved by dry-developing a thin silicon-containing resist through oxygen plasma. This process, however, has the drawbacks that synthesis of polysiloxane-based resists rendered photosensitive becomes complicated and thus results in a rise in cost and that it is difficult to control, with good repeatability, the content of silicon giving a large influence on oxygen plasma resistance. The silicon content and the performance of a resist (sensitivity, resolution) are generally in a conflicting relation. That is, increasing the silicon content improves oxygen plasma resistance but deteriorates the performance of a resist. Decreasing the silicon content improves the performance of a resist (sensitivity, resolution) but leads to degradation of oxygen plasma resistance. For such reasons, improving the performance of a resist while keeping its oxygen plasma resistance level high is difficult. In addition, in such resists, the contrast (difference in solubility in a developer) between exposed areas and non-exposed areas is insufficient to improve the resolution.

A photosensitive paste being a photosensitive resin filled with an inorganic compound such as a silicon compound in the form of microfine particles has also been known. Improvement of its oxygen plasma resistance requires the paste to be filled with a larger amount of the inorganic microfine particles. However, an increase in the content of the inorganic microfine particles, due to absorption, reflection, or scattering of light by the particles, results in deterioration in sensitivity and resolution.

On the other hand, there have been known compositions comprising an alkali-soluble novolak resin and a diazonaphthoquinone derivative as resists for semiconductors. Utilizing the characteristic that a diazonaphthoquinone group is decomposed upon irradiation with light of 300 to 500 nm wavelength to form a carboxyl group, allowing the compositions to change from an alkali-insoluble state to an alkali-soluble state, these photosensitive resin compositions have been used as positive resists. However, when used in combination with the silicon-containing inorganic microfine particles described above, the sensitivity is largely degraded. The use of silicasol as the inorganic microfine particles improves the transmittance of light with which to irradiate the resist but cannot improve the resolution.

As a means for improving the sensitivity and resolution even with an large inorganic component content, Japanese Patent Application Laid-Open No. 194491/1999 proposes a photosensitive resin composition composed of a photosensitive organic oligomer or polymer, a hydrolytic polymerizable organic metal compound or its condensate, and an inorganic filler having a functional group.

Japanese Patent Application Laid-Open No. 158235/1993 discloses a resist composition composed of: a resist being a mixture of cresolnovolak and a naphthoquinonediazide sulfonate; and silicasol added thereto.

In these resists, however, only not so large a difference in dissolution rate can be made between exposed portions and non-exposed portions and therefore the resolution can be improved only to a limited extent.

In the novolak-series semiconductor resist, the most conventional method for achieving miniaturization or minuter patterns is to use an exposure light of a shorter wavelength. For example, instead of using g-ray (wavelength: 436 nm) or i-ray (wavelength: 365 nm) of high-pressure mercury lamps generally used, a light source of a shorter wavelength such as KrF excimer laser (wavelength: 248 nm) and ArF excimer laser (wavelength: 193 nm) of next generation have already come into practical use.

However, the use of novolak resin/diazonaphthoquinone-type positive resists having been employed in the production of semiconductor integrated circuits using g-ray or i-ray leads to considerable deterioration in sensitivity and resolution even with KrF excimer laser or ArF excimer laser because of the absorption of light by the novolak resin. Therefore, the novolak resin/diazonaphthoquinone-type positive resists are lacking in practicability.

Moreover, minute processing with KrF or ArF excimer laser has a number of technical problems to be solved with respect to the choice of, for example, exposing devices such as light sources and lens systems, and photosensitive materials (resists). In addition, plant investment for applying the minute processing with KrF or ArF excimer laser to the practical production of semiconductors will be a vast sum of money.

SUMMARY OF THE INVENTION

Accordingly, it is an object of the present invention to provide active particles capable of, when incorporated into a photosensitive resin, making the difference in dissolution rate between exposed areas and non-exposed areas larger while keeping the oxygen plasma resistance of a photosensitive layer high, and useful in forming patterns with high sensitivity and high resolution; a photosensitive resin composition containing the same; and a process for forming a pattern using the resin composition.

Another object of the present invention is to provide a photosensitive resin composition capable of improving, even in the case with existing equipment, heat resistance as well as sensitivity and resolution; a process for producing the same; and a process of forming a pattern using the resin composition.

Still another object of the present invention is to provide a process for improving the sensitivity and resolution of the photosensitive resin.

The inventors of the present invention made intensive studies to achieve the above objects and finally found that addition of active particles, which accelerates the solubility of exposed area in a developer (e.g., alkalis) and interact with a photosensitizer with the aid of a developer (e.g., alkalis) in non-exposed areas, to a resin composition comprised of a base resin and a photosensitizer (e.g., novolak-series phenolic resin/quinonediazide) increases the difference in the rate of dissolution between exposed areas and non-exposed areas, making it possible to form patterns with high sensitivity and high resolution. The present invention was accomplished based on the above finding.

That is, the active particles of the present invention are for use in combination with a photosensitizer contained in a photosensitive resin, each comprising a particulate carrier and an aromatic unit which is directly or indirectly bonded thereto and, with the aid of a developer (e.g., alkalis), becomes active (e.g., interactive, reactive) to the photosensitizer. The active particles may have a structure in which, via a coupling agent, a particulate carrier is bonded to an aromatic unit having a phenolic hydroxyl group. The aromatic unit, for the purpose of enhancing the interactivity with a photosensitizer with the aid of a developer (e.g., alkalis), may have no substituent at least either in the o-position or p-position in relation to the phenolic hydroxyl group. The mean particle size of the particulate carriers may be about 1 to 100 nm. Such active particles react with a photosensitizer (e.g., quinonediazides) in non-exposed areas, making a difference insolubility in a developer (e.g., alkalis) between exposed parts and non-exposed parts.

The photosensitive resin composition of the present invention comprises: a base resin, a photosensitizer, and the active particles described above. In the photosensitive resin composition, the photosensitive resin may be of positive type which can be developed with water or an alkali. Examples of such photosensitive resin include photosensitive resin compositions being combinations of novolak-series phenolic resins and quinondiazides.

The process of the present invention includes: a process for improving at least either sensitivity or resolution by adding the above mentioned active particles to a photosensitive resin comprised of a base resin and a photosensitizer; and a process of forming a pattern in which the photosensitive resin composition is applied to a substrate, exposed, and developed.

DETAILED DESCRIPTION OF THE INVENTION

The active particles of the present invention is a component which is used in combination with a photosensitizer incorporated into a photosensitive resin, each particle comprising a particulate carrier and an aromatic unit directly or indirectly bonded thereto. The aromatic unit becomes active toward the photosensitizer (e.g., interactive, reactive) by the action of an alkali.

The use of the particulate carrier, probably because the resulting particles are soaked with a developer, raises the efficiency of development. Although, as the particulate carrier, an organic fine particle (e.g., styrenic resins, such as polystyrene, which maybe crosslinked; (meth)acrylic resins, such as methyl polymethacrylate, which may be crosslinked; silicone resin, crosslinked melamine resin, crosslinked guanamine resin) can be used, the use of an inorganic fine particle excellent in, for example, oxygen plasma resistance, heat resistance, and dry etching resistance is advantageous.

As the inorganic particulate carrier, use can be made of a simple metal (gold, silver, copper, platinum, aluminum), an inorganic oxide (e.g., silica (silicasol such as colloidal silica; aerogel; glass), alumina, titania, zirconia, zinc oxide, copper oxide, lead oxide, yttrium oxide, tin oxide, indium oxide, magnesium oxide), an inorganic carbonate (e.g., calcium carbonate, magnesium carbonate), an inorganic sulfate (e.g., barium sulfate, calcium sulfate), an inorganic phosphate (e.g., calcium phosphate, magnesium phosphate), and others. The inorganic particulate carrier includes sols and gels prepared by, for example, a sol-gel process. These inorganic particulate carriers can be used either singly or in combination.

Preferred as the inorganic particulate carrier is silica (particularly, silicasol). The use of silica as the inorganic particulate carrier makes it possible to increase the silicon content and significantly improve the oxygen plasma resistance without lowering the performance of the resist (e.g., sensitivity, resolution). Particularly, the use of silicasol (e.g., colloidal silica) leads to the formation of a thinner photosensitive layer and exposure deep into the photosensitive layer, improving the sensitivity and the resolution.

The shape of the inorganic particulate carrier is not limited to sphere and may be spheroid, disk, rod-like or fibrous. The mean particle size of the particulate carriers is usually smaller than the wavelength of light (substantially transparent toward the wavelength of light used for irradiation). The mean particle size of the particulate carrier depends on the degree of minuteness of a pattern to be formed and can be selected within the range of, by the BET process, about 1 to 1,000 nm, preferably about 2 to 1,000 nm (e.g., 5 to 500 nm), more preferably 1 to 100 nm (e.g. 2 to 100 nm). Preferably, the carriers are those having a mean particle size of about 1 to 50 nm, preferably 5 to 50 nm (e.g., 7 to 30 nm) (particularly, inorganic particulate carriers such as colloidal silica). Monodispersed inorganic particulate carriers (especially, colloidal silica) are commercially available as organosols (organosilicasol), and can be obtained from, e.g., Nissan Kagaku Kogyo, Co. Ltd. under the tradename "Snowtex colloidal silica".

Although the particulate carrier and the aromatic unit may directly be bonded together at the functional group of the carrier (e.g., hydroxyl group that silicasol has), usually, they are indirectly bonded together via a coupling agent.

Examples of the coupling agent are compounds having a group reactive to the particulate carrier and a group reactive to a compound having an aromatic unit, such as organic metal compounds containing an alkaline earth metal, a transition metal, a rare metal, or a metal element of the Group 3 to 5 and 13 to 15 of the Periodic Table of Elements, particularly those containing an element of the Groups 4, 13, and 14 (e.g., aluminum, titanium, zirconium, silicon). Of the organic metal compounds, titanium coupling agents and silane coupling agents (particularly, silane coupling agents) are preferred.

The silane coupling agents include compounds represented by the following formula:

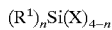

$$(R^1)_n Si(X)_{4-n}$$

wherein $R^1$ is a $C_{1-4}$ alkyl or aryl group having a group reactive to the aromatic unit; X is a halogen atom (e.g., fluorine atom, chlorine atom, bromine atom, iodine atom) or $OR^2$; $R^2$ is an alkyl group having 1 to 4 carbon atoms; $R^1$ and $R^2$ may be the same or different; and n is an integer of 0 to 2.

In the coupling agent, the group reactive to the aromatic unit is selected according to the reactive group of the aromatic unit, including isocyanate group, carboxyl group, epoxy group, amino group, hydroxyl group, vinyl group, and others. In the coupling agent, the group reactive to the particulate carrier is usually a hydrolyzed condensate group such as a halogen atom and alkoxy group.

Silane coupling agents having reactive groups as described above include: isocyanate group-containing silane coupling agents [e.g., isocyanatoalkylalkoxysilanes (e.g., isocyanato$C_{1-6}$alkyl$C_{1-4}$alkoxysilanes) typified by isocyanatomethyltrimethoxysilane, 1- or 2-isocyanatoethyltrimethoxysilane, 1-, 2-, or 3-isocyanatopropyltrimethoxysilane, isocyanatomethyltriethoxysilane, 1 or 2-isocyanatoethyltriethoxysilane, 1-, 2-, or 3-isocyanatopropyltriethoxysilane, isocyanatomethylmethyldimethoxysilane, di(isocyanatomethyl)dimethoxysilane, isocyanatoethylethyldiethoxysilane, di(isocyanatoethyl)diethoxysilane; halogenated alkylisocyanatoalkylalkoxysilanes (e.g., halogenated $C_{1-4}$alkylisocyanato$C_{1-6}$alkyl$C_{1-4}$alkoxysilanes) typified by isocyanatomethylchlorodimethoxysilane and γ-chloropropylisocyanatomethyldiethoxysilane; aminoalkylisocyanatoalkylalkoxysilanes (e.g., amino $C_{1-4}$alkylisocyanato$C_{1-6}$alkyl$C_{1-4}$alkoxysilanes) typified by γ-aminopropylisocyanatoethyldimethoxysilane and γ-aminopropylisocyanatoethyldiethoxysilane; isocyanatoalkylarylalkoxysilanes (e.g., isocyanato$C_{1-6}$alkyl $C_{6-10}$aryl$C_{1-4}$alkoxysilanes) typified by isocyanatomethylphenyldimethoxysilane and isocyanatopropylphenyldipropoxysilane]; carboxyl group-containing silane coupling agents (carboxyl group-containing silane coupling agents corresponding to the above-listed isocyanate group-containing silane coupling agents); epoxy group-containing silane coupling agents [e.g., epoxyalkylalkoxysilanes (e.g., epoxy group-containing $C_{3-8}$alkyl-$C_{1-4}$alkoxysilanes) typified by 1,2-epoxypropyltrimethoxysilane, 1,2-epoxypropyltriethoxysilane, glycidyltrimethoxysilane, glycidyltriethoxysilane, glycidyltripropoxylsilane; glycidoxyalkylalkoxysilanes (e.g., glycidoxy$C_{1-6}$alkyl $C_{1-4}$alkoxysilanes) typified by 3-glycidoxypropyltrimethoxysilane and 3-glycidoxypropylmethyldimethoxysilane]; amino group-containing silane coupling agents [e.g., amino group-containing silane coupling agents corresponding to the above-listed isocyanate group-containing silane coupling agents, particularly aminoalkylalkoxysilanes in which the nitrogen atom in the amino group may be substituted by an aminoalkyl group (particularly, amino$C_{1-6}$alkyl-$C_{1-4}$alkoxysilanes in which the nitrogen atom of the amino group may be substituted by an amino$C_{1-4}$alkyl group) typified by N-(2-aminoethyl)3-aminopropylmetyldimethoxysilane, N-(2-aminoethyl)3-aminopropyltrimethoxysilane, 3-aminopropyltrimethoxysilane, and 3-aminopropyltriethoxysilane]; mercapto group-containing silane coupling agents [e.g., mercapto group-containing silane coupling agents corresponding to the isocyanate group-containing silane coupling agents enumerated above, particularly mercarptoalkylalkoxysilanes (e.g., mercapto $C_{1-6}$alkyl$C_{1-4}$alkoxysilanes) typified by γ-mercarptopropyltrimethoxysilane and γ-mercaptopropyltriethoxysilane]; hydroxyl group-containing silane coupling agents (hydroxyl group-containing silane coupling agents corresponding to the above-listed isocyanate group-containing silane coupling agents); vinyl group-containing coupling agents [e.g., vinylalkoxysilanes (e.g., vinyl$C_{1-4}$alkoxysilanes) typified by vinyldimethylethoxysilane, vinylmethyldiethoxylsilane, vinyltrimethoxysilane, vinyltriethoxysilane, vinyltriisopropoxysilane, vinyltris-t-butoxysilane, vinyltris (2-methoxyethoxy)silane, and vinyltrisisopropenoxysilane; vinyl-halogenated silanes (e.g., vinyl-chloro or bromosilanes) typified by vinyldimethylchlorosilane, vinylmethyldichlorosilane, vinylethyldichlorosilane, and vinyltrichlorosilane; vinyl-ketoximinesilanes (e.g., vinyl (di$C_{1-4}$alkylketoximine)silanes) typified by vinylmethylbis (methylethylketoxime)silane); vinyl-siloxysilanes (e.g., vinyl(tri$C_{1-4}$alkylsiloxy)silanes) typified by vinylmethylbis (trimethylsioxy)silane; vinyC$_{2-6}$alkylcarbonyloxysilanes (e.g., vinyl-C$_{2-4}$alkylcarbonyloxysilanes) typified by vinyl-methyldiacetoxysilane and vinyltriacetoxysilane; vinylaryloxysilanes such as vinyltriphenoxysilane; vinyl-peroxysilanes (e.g., vinyl-$C_{1-6}$alkylperoxysilenes) such as vinyltris(t-butylperoxy)silane]; allyl group-containing silane coupling agents and (meth)acryloyl group-containing silane coupling agents corresponding to the above-mentioned vinyl group-containing silane coupling agents. Those commercially available are also usable as the silane coupling agent.

Examples of the organic metal compounds containing aluminum, titanium, or zirconium are those corresponding to the silane coupling agents listed above.

The proportion of the coupling agent is, for example, about 0.1 to 100 parts by weight, preferably about 0.5 to 50 parts by weight, more preferably about 1 to 20 parts by weight relative to 100 parts by weight of the inorganic particulate carriers.

The aromatic unit becomes active toward a photosensitizer under the action of a developer (e.g., alkalis) and has a phenolic hydroxyl group for accelerating the interaction or reaction (e.g., coupling reaction) with the photosensitizer. Particularly, it is preferred that the aromatic unit has no substituent at least either in the o-position or the p-position in relation to the phenolic hydroxyl group. For example, in the case of the use of a diazonium-series photosensitizer (e.g., quinonediazides) as the photosensizer, in the aromatic unit, it seems that an azo-coupling reaction occurs at the o- or p-position in relation to the hydroxyl group during the development with an alkali. Such reaction with the photosensitizer at the non-exposed areas seems to make a difference in solubility in the alkali between the exposed areas and the non-exposed areas, controlling the solubility of the photosensitive layer.

As the compound having such aromatic unit, aromatic compounds having a phenolic hydroxyl group and a group reactive to the coupling agent or to the particulate carrier are usable. Examples of the group reactive to the coupling agent or to the particulate carrier are hydroxyl, amino, carboxyl, isocyanate, epoxy, and vinyl groups.

As a compound having a reactive group being hydroxyl group, use can be made of aromatic polyhydroxy compounds (e.g., aromatic di- or trihydroxy compounds, particularly aromatic dihydroxy compounds) such as hydroxyphenols typified by hydroquinone, resorcin, catechol, phloroglucin, oxyhydroquinone, pyrogallol, alkyl gallates (e.g. $C_{1-4}$alkyl gallates); hydroxyarylalkyl alcohols (e.g., hydroxy$C_{6-10}$aryl-$C_{1-4}$alkyl alcohols) such as oxybenzyl alcohol; hydroxybenzophenones; polyhydroxynaphthalenes such as naphthalenediols and naphthalenetriols; biphenol; bisphenols (e.g., bisphenol A, bisphenol F, bisphenol AD).

Amino group-containing aromatic compounds (e.g., aminophenols, aminocresols, aminobenzyl alcohol, aminobenzoic acid, aminosalicylic acid), carboxyl group-containing aromatic compounds (e.g., hydroxybenzoic acid, dihroxybenzoic acid, benzenedicarboxylic acids and their acid anhydrides, gallic acid), isocyanate group-containing aromatic compounds, epoxy group-containing aromatic compounds (e.g., glycidyl phenol), vinyl group-containing aromatic compounds (e.g., vinylphenol) are also available.

In the case where a silane coupling agent having an isocyanate group is used, a compound having a reactive group such as hydroxyl group and amino group can be used as the compound having an aromatic unit. In the case with a silane coupling agent having an epoxy group, a compound having a reactive group such as carboxyl group and amino group can be used.

The ratio of the reactive group of the aromatic unit to the group reactive toward the aromatic unit of the silane coupling agent is the former/the latter=about 0.5/1 to 2/1 (molar ratio), preferably about 0.7/1 to 1.5/1 (molar ratio).

The active particle can be produced by, directly or indirectly, reacting and bonding the aromatic unit with the particulate carrier. In the case of indirect bonding via the coupling agent, the order of the reactions is not particularly restricted. The coupling agent may be reacted with one component selected from the aromatic unit and the particulate carrier, and then with the other one. The three components may be mixed and reacted at the same time. In the silane coupling agent, either the group reactive toward the aromatic unit or the group reactive toward the particulate carrier may if necessary be protected by a protective group. If a silane coupling agent having an isocyanate group is employed, it is preferred that the coupling agent is reacted with the aromatic unit (phenolic compound) under such conditions that the isocyanate group can maintain its activity (e.g., in the absence of moisture, in the presence of such an amount of moisture so as not to adversely affect the activity of the isocyanate group substantially, particularly, in the absence of moisture), and then with silicasol.

In each reaction step, if necessary, a conventional catalyst (e.g., acids) or solvent may be used. As the solvent, water, organic solvents such as alcohols, glycols, cellosolves, ketones, esters, ethers, amides, hydrocarbons, halogenated hydrocarbons, carbitols, glycol ether esters (e.g., cellosolve acetate, propylene glycol, monomethyl ether acetate), and others are usable.

Such active particles, when added to the photosensitive resin which will later be described to constitute a photosensitive layer, react with the following photosensitizer (quinonediazides) in the non-exposed areas, making a difference in solubility in an alkali between the exposed-areas and the non-exposed areas.

Photosensitive Resin Composition

The photosensitive resin composition (or resist composition) of the present invention comprises a photosensitive resin and active particles. In the specification of the present invention, the term "photosensitive resin" is used in the same sense as that of the photosenstivie oligomer or polymer.

Photosensitive Resin

The photosensitive resin may be of negative type or positive type. Although a resin (oligomer or polymer) which itself is photosensitive (e.g., a polymer having a photodimerization-type functional group such as cinnamoyl group and cinnamylidene group, such as diazonium base-containing polymers, azide group-containing polymers, polyvinyl cinnamate), a photosenstivie resin (composition) containing a base resin (e.g., an oligomer or polymer) and a photosensitizer is employed.

(Base Resin (Polymer or Oligomer)

The species of the base resin can be selected according to which type of resist, positive or negative, is to be formed. Although there is no particular restriction, if the resin composition of the present invention is to be utilized as a resist for semiconductor production, phenol novolak resins, polyvinylphenol-series polymers, and others can be used as the base resin. Usually, the base resin has a phenolic hydroxyl group.

As the novolak resin, an alkali-soluble novolak resin is usually employed. When utilizing as a resist for semiconductor production, novolak resins conventionally employed in the field of resist can be used. The novolak resin can be obtained by condensing a phenol having at least one phenolic hydroxyl group in the molecule with an aldehyde in the presence of an acid catalyst. Examples of the phenol are, for example, alkylphenols (particularly, $C_{1-4}$alkylphenols) such as phenol, o-, m-, and p-cresols, 2,5-, 3,5-, and 3,4-xylenols, 2,3,5-trimethylphenol, ethylphenol, propylphenol, butylphenol, 2-t-butyl-5-m-ethylphenol; dihydroxybenzenes; and naphthols. Examples of the aldehyde are aliphatic aldehydes such as formaldehyde, acetaldehyde, and glyoxal; and aromatic aldehydes such as benzaldehyde and salicylaldehyde.

These phenols can be used either singly or as a combination of two or more species, and the aldehydes can also be used singly or in combination. As the acid catalyst, there may be exemplified inorganic acids (e.g., hydrochloric acid, sulfuric acid, phosphoric acid), organic acids (e.g., oxalic acid, acetic acid, p-toluenesulfonic acid), and organic acid salts (e.g., divalent metal salts such as zinc acetate). The condensation reaction can be carried out according to a conventional method, e.g., at a temperature of about 60° C. to 120° C. for about 2 to 30 hours. The reaction may be conducted without a diluent or in a suitable solvent.

There is no particular restriction as to the polyvinylphenol-series polymer provided that it is a polymer having a vinylphenol as a constitutional unit, and may be a homo- or copolymer of vinylphenol or its derivative; or a copolymer with other copolymerizable monomer.

The base resin is not limited to the novolak resins and polyvinylphenol-series polymers listed above, and may be a hydroxyl group-containing polymer [e.g., polyvinyl alcohol-series polymers, polyvinyl acetal, ethylene-vinyl alcohol copolymer, hydroxyl group-containing cellulose derivatives (e.g., hydroxyethylcellulose)], a carboxyl group-containing polymer [e.g., homo- or copolymers containing a polymerizable unsaturated carboxylic acid ((meth)acrylic acid, maleic anhydride, itaconic acid) and esters thereof, carboxyl group-containing cellulose derivatives (e.g., carboxymethylcellulose and salts thereof)], an ester group-containing polymer [e.g., homo- or copolymers containing a monomer such as a vinyl carboxylate (e.g., vinyl acetate) or a (meth) acrylate (e.g., methyl methacrylate), such as polyvinyl acetate, ethylene-vinyl acetate copolymer, (meth)acrylic resins); saturated or unsaturated polyesters; vinyl ester resins; diallyl phthalate resins; cellulose esters], a polymer having an ether group [e.g., polyalkylene oxide, polyoxyalkylene glycol, polyvinyl ether, silicone resin, cellulose ethers], a carbonate group-containing polymer, a polymer having an amide or substituted amide group [e.g., polyvinylpyrrolidone, polyurethane-series polymers, polyureas, nylons and polyamide-series polymers (polyamides obtained from a lactam component, a dicarbonic acid component, or a diamine component (e.g., nylon 66, nylon 6, modified nylons, star-burst dendrimer (D. A. Tomalia. et al., Polymer Journal, 17,117 (1985)); poly(meth) acrylamide-series polymers, polyamino acids; polymers having a biuret bond; polymers having an allophanate bond; proteins such as gelatin], a nitrile group-containingpolymer (e.g., acrylonitrile-series polymer), a glycidyl group-containing polymer (e.g., epoxy resin, homo-or copolymers of glycidyl (meth)acrylate), or a halogen-containing polymer (e.g., polyvinyl chloride, vinyl chloride-vinyl acetate copolymer, vinylidene chloride-series polymers, chlorinated polypropylene). The base resin may be a polymerizable oligomer or polymer having a polymerizable group such as (meth)acryloyl group, allyl group, and others may be used singly or combination.

As the polymerizable oligomer having a polymerizable group, there may be exemplified epoxy(meth)acrylates (e.g., resins formed by reactions of epoxy resins with (meth) acrylic acid); polyester (meth)acrylates; unsaturated polyester resins; polyurethane (meth)acrylates [e.g., reaction products of diol components (e.g., polyalkylene glycol, polyester diol), diisocyanates (e.g., 2,4-tolylenediisocyanate), and hydroxyl group-containing polymerizable monomers (e.g., 2-hydroxyethyl methacrylate), urethane reaction products of compounds having a hydroxyl group and a polymerizable unsaturated group (e.g., hydroxyethylphthalyl (meth) acrylate, trimethylolpropane diallyl ether) with diisocyanates (e.g., xylylene isocyanate, 2,4-tolylenediisocyanate)]; polymerizable polyvinyl alcohol-series polymers (e.g., the reaction products of polyvinyl alcohols with N-methylolacrylamide); polyamide-series polymers; and silicone resin-type polymers.

(Photosensitizer)

A conventional photosensitizer or sensitizer can be employed as the photosensitizer used in the present invention, depending on the type of the resulting photosensitive resin (positive type or negative type). Considering the interaction or reaction between the active particle and the photosensizier, while the photosensitive resin may be of negative type, the use of a photosensitive resin of positive type is preferred.

In the case where the photosensitizer is used in combination with a photosensitive resin of positive type, the photosensitizer can be selected from, for example, diazonium salts (e.g., diazonium salts, tetrazonium salts, polyazonium salts), quinonediazides (e.g., diazobenzoquinone derivatives, diazonaphthoquinone derivatives), with quinonediazides (particularly, diazoanaphthoquinone derivatives) preferred.

Such positive photosensitive resin composition is composed of a base resin (e.g., any of the novolak phenol resins or polyvinyl phenol resins mentioned above) and a photosensitizer [e.g., a quinonediazides (diazobenzoquinone derivatives, diazonaphthoquinone derivatives)], and it is desired that the resin composition is developable with water or an alkali.

The amount of the photosensitizer to be used can be selected within the range of, relative to 100 parts by weight of the photosensitive resin, about 0.1 to 50 parts by weight, preferably about 1 to 30 parts by weight, more preferably about 1 to 20 parts by weight (particularly, 1 to 10 parts by weight).

When a novolak resin is used as a positive photosensitive resin (particularly, a resist for use in the production of semiconductors), among the photosensitizers (quinonediazides) listed above, the diazobenzoquinone derivatives can be obtained by a reaction of 1,2-benzoquinone-4-sulfonyl with a hydroxyl group-containing compound (e.g., a polyhydric phenol), and the diazonaphthoquinone derivatives can be obtained by a reaction of 1,2-naphthoquinone-4-sulfonyl or 1,2-naphthoquinone-5-sulfonyl with a hydroxyl group-containing compound (e.g., a polyhydric phenol).

The hydroxyl group-containing compound may be a mono- or polyhydric alcohol, or a phenol having at least one hydroxyl group. Examples of phenols are, besides the phenols exemplified in the paragraphs referring to the novolak resin, hydroquinone; resorcin; phloroglucin; alkyl gallates, 2,4-dihydroxybenzophenone; 2,3,4-trihydroxybenzophenone; tetrahydroxybenzophenones (e.g., 2,3,3',4-tetrahydroxybenzophenone, 2,3,4,4'-tetrahydroxybenzophenone, 2,2',4,4'-tetrahydroxybenzophenone); pentahydroxybenzophenones (e.g., 2,3,3',4,4'-pentahydroxybenzophenone, 2,3,3',4,5'-pentahydroxybenzophenone); polyhydroxytriphenyl-methanes such as tri- or tetrahydroxytriphenylmethane [e.g., (3,4-dihydroxybenzylidene)bis(2-t-butyl-5-methoxyphenol), (3,4-dihydroxybenzylidene)bis(2-cyclohexyl-5-methoxyphenol), (3,4-dihydroxybenzylidene) bis(2-t-butyl-4-methoxyphenol), (3,4-dihydroxybenzylidene)bis(2-cyclohexyl-4-methoxyphenol)]; and polyhydroxyflavans (e.g., 2,4,4-trimethyl-2'4'7-trihydroxyflavan, 2,4,4-trimethyl-2'3'4'7,8-pentahydroxyflavan, 6-hydroxy-4a-(2,4-dihydroxyphenyl)-1,2,3,4,4a,9a-hexahydroxanthene-9-spiro-1'-cyclohexane).

The photosensitive resin to be used can be selected according to the wavelength of light which is used for irradiation. For example, if g-ray (436 nm) or i-ray (365 nm is employed as light for irradiation, the photosensitive resin may be comprised of a novolak resin and a quinonediazide (e.g., diazonaphthoquinone derivative).

In the photosensitive resin composition of the present invention, the proportion of the active particles contained therein can be selected within such a range that sensitivity, resolution of the resulting patterns, and other characteristics are not adversely affected, and is usually, in terms of the solid matter content of the particulate carriers (not including components that are produced upon heating (e.g., condensed water, alcohol)), about 5 parts by weight or more per 100 parts by weight of the photosensitive resin. The upper limit of the amount of the particulate carriers need only be such that the resulting resin composition is capable of forming a film (usually, 1,000 parts by weight or less). The proportion of the particulate carriers is, relative to 100 parts by weight of the photosensitive resin, about 10 to 500 parts by weight (e.g., 10 to 400 parts by weight), preferably about 20 to 300 parts by weight, more preferably about 30 to 300 parts by weight (e.g., 30 to 200 parts by weight), particularly about 50 to 150 parts by weight. Even with a content of about 20 to 50 parts by weight, high oxygen plasma resistance can be obtained. An inorganic particulate carrier content of 20% by weight or higher largely improves the oxygen plasma resistance. With an inorganic particulate carrier content of 50% by weight or higher, the resulting resin composition becomes substantially resistant to etching by oxygen plasma.

The use of, as the particulate carrier (particularly, silicasol), carriers of which the mean particle size is smaller than the wavelength of light for irradiation use (that is, inorganic particulate carriers substantially transparent toward the wavelength of light for irradiation use) allows for the introduction of the inorganic particle carriers into the resin composition at a high concentration without being influenced by absorption, scattering, or reflection of light, improving the oxygen plasma resistance, thermal resistance, dry etching resistance, and other properties.

If necessary, the photosensitive resin composition may comprise a photoreaction accelerator (e.g., polymerization accelerator), such as a dialkylaminobenzoic acid or its derivative, triphenylphosphine, trialkylphosphine, or others. Further, to the composition may be added an alkali-soluble component such as an alkali-soluble resin, a stabilizer such as an antioxidant, a plasticizer, a surfactant, a dissolution accelerator, a coloring agent such as dyes and pigments, and other various additives. In order to improve the working efficiency such as coatability, the resin composition may contain a solvent (e.g., the solvents exemplified in the paragraphs referring to the active particles).

The photosensitive resin composition of the present invention can be prepared by a conventional process, such as by mixing a base resin (polymer or oligomer), a photosensitizer, and active particles. The photosensitive resin composition usually contains a solvent (particularly, a hydrophilic solvent such as an alcohol). The components may be mixed together simultaneously or in a suitable order.

Photosensitive Layer

The photosensitive layer can be formed by applying (coating, covering) the photosensitive resin composition described above to a substrate. According to the intended pattern and use, the substrate is suitably selected from metals (aluminum), glass, ceramics (alumina, copper doped alumina, tungsten silicate), plastics, and others, and the substrate may be a semiconductor substrate such as silicone wafer.

The surface of the substrate may be treated thereby to improve the adhesion with the photosensitive layer, depending on its intended use. The surface treating includes a surface treating method using the silane coupling agent described above (e.g., a hydrolytic polymerizable silane coupling agent having a polymerizable group), a coating process with an anchor coating agent or base coat agent (e.g., polyvinyl acetal, acrylic resin, vinyl acetate-series resin, epoxy resin, urethane resin), or with a mixture of such base coat agent and inorganic fine particles, and others.

After the photosensitive resin composition has been applied to a substrate, the resin may be soft-baked at a suitable temperature (e.g., 80 to 100° C.) and for a suitable period of time (e.g., 1 to 2 minutes) by a hot plate or other heating means thereby to evaporate the solvent.

So that the photosensitive resin composition of the present invention is excellent in oxygen plasma resistance, thermal resistance, dry etching resistance, it is preferred that the photosensitive layer constitutes at least the surface of a resist. The structure of the photosensitive layer can be selected according to the process of forming patterns or the intended circuit structure, and may be a single- or multi-layered structure (or complex structure). For example, a single-layered photosensitive layer is utilized in a single-layer forming process in which a single photosensitive layer is formed on a substrate to form a pattern, and particularly suitable for use in forming a heat-resistant pattern by dry etching. A multi-layered (or composite) photosensitive layer improves the oxygen plasma resistance largely and therefore is advantageous in improving the resolution even when the wavelength of light for irradiation is in the neighborhood of the limit of lithography resolution. For example, a double-layered photosensitive layer is utilized in a double-layer forming process comprising: forming an undercoat resist layer on a substrate, forming a photosensitive layer thereon, exposing the photosensitive layer to light, developing the latent pattern, and etching the undercoat by oxygen plasma or other means to give a pattern. A triple-layered photosensitive layer can be utilized in a multi-layer forming process in which an undercoat layer, an intermediate layer, and a photosensitive layer are formed on a substrate in this order, exposed to light, and patterned by developing and the intermediate and undercoat layers are then etched. The undercoat and intermediate layers may be made from compositions composed of any photosensitive resin exemplified above and inorganic finely divided particles, or from photosensitive resins containing no inorganic finely divided particle.

The thickness of the photosensitive layer is not particularly limited and can be selected within the range of, for example, about 0.01 to 10 μm, preferably about 0.05 to 5 μm, more preferably about 0.1 to 2 μm. The thickness is usually within the range of about 0.1 to 1 μm (e.g., 0.1 to 0.5 μm).

Application of the photosensitive composition can be carried out by a conventional coating method such as spin coating, dip coating, and cast coating. If necessary, the photosensitve composition applied on the substrate is dried to remove the solvent therefrom.

Pattern Forming Method

Patterning (particularly, minute patterns) can be carried out by a conventional lithography technique which is a combination of exposure, development, and etching. The photosensitive layer can be patterned in accordance with a conventional process, for example, by irradiating with or exposing the layer to light through the predetermined mask. After the pattern has been developed, the layer may be subjected to etching by oxygen plasma.

Depending on the photosensitive properties of the photosensitive resin composition, the degree of fineness of the intended pattern, the kind of the base resin, etc., a variety of beams can be used (e.g., halogen lamp, high-pressure mercury lamp, UV lamp, excimer laser, irradiation of electron beam, X-ray). The beam may be of a single wavelength or of a compound wavelength. For the exposure, usually, g-ray (e.g., 436 nm), i-ray (365 nm), excimer laser [e.g., XeCl (308 nm), KrF (248 nm), KrCl (222 nm), ArF (193 nm), and ArCl (172 nm)] are advantageously employed. When forming a resist which is used in semiconductor production with the use of the photosensitive resin composition of the present invention, sufficient levels of sensitivity and resolution can be achieved by the use of such laser beams as g-ray and i-ray, there being no particular need for the use of excimer laser.

The energy for the exposure is within such a suitable range that the resin becomes readily soluble, and can be selected within the range of about 0.05 to 50 mJ/cm$^2$, preferably about 0.1 to 25 mJ/cm$^2$, andmore preferably about 0.5 to 25 mJ/cm$^2$. Usually, the exposure time can be selected within the range of about 0.01 second to 20 minutes, preferably about 0.1 second to 1 minute.

Development of the layer in a conventional manner following the patternwise exposure gives a pattern with high resolution.

Any of a variety of developers or developing agents (e.g., water, alkaline solutions, organic solvents, and mixtures thereof) can be used and the choice depends on the type of the photosensitive resin composition (negative or positive, particularly, a positive one). Preferred developers include water and alkaline developers. If necessary, the developer may contain a small amount of an organic solvent (e.g., hydrophilic or water-soluble solvents such as alcohols typified by methanol, ethanol, and isopropanol; ketones typified by acetone; ethers typified by dioxanes and tetrahydrofurane; cellosolves; cellosolve acetates), a surfactant, and others. There is no particular restriction on the developing process, and the paddle (meniscus) method, dipping method, spraying method, and others are adoptable.

Through a sequence of steps from the application of the photosensitive resin composition to the development, at a suitable step, the coating (photosensitive layer) may be heated or cured at a suitable temperature. If necessary, the coating is heated after having been exposed to light or developed. The coating, after having been developed by a developer such as an alkali, may be heated by prebaking or other means thereby to allow the photosensitizer to interact (particularly, react) with the active particles in the non-exposed areas.

In the present invention, the active particles described above are added to a photosensitive resin comprised of a base resin and a photosensitizer to give a resin composition;

a photosensitive layer is formed from the resin composition obtained above; and the photosensitive layer is exposed to light through a predetermined mask; and the layer is developed. This makes a difference in solubility between the exposed areas and non-exposed areas leading to improvements in sensitivity and resolution. In a positive photosensitive resin composition, solubilization in a developer is accelerated in the exposed areas, but inhibited in the non-exposed areas. In a negative photosensitive resin composition, solubilization is inhibited in the exposed areas, but accelerated in the non-exposed areas.

Concretely, when an alkali-soluble novolak resin and quinonediazide are used as the base resin and the photosensitizer respectively, the particulate carriers of the active particles accelerate the solubilization of the exposed portions in a developer, and the solubilization of the non-exposed portions in a developer is, due to the interaction (e.g., azo coupling reaction) between the aromatic unit and quinonediazide caused by the developer (e.g., an alkali), largely inhibited, making a difference in solubility between the exposed areas and non-exposed areas, which results in improvements in sensitivity and resolution.

The present invention has a variety of applications and is available for use in, for example, circuit forming materials (e.g., resists for semiconductor production, printed-wiring boards) and imaging materials (e.g., printing plate materials, materials for relief printing). Particularly, since a resist formed according to the present invention has higher sensitivity and resolution, it is advantageously utilized as a resist for semiconductor production.

In the present invention, the active particles constituted of specific components are added to a photosensitive resin (composed of a base resin and a photosensitizer), making a difference in solubility between the exposed areas and non-exposed areas larger, which results in improvements in sensitivity and resolution. If the particulate carrier of the active particle is an inorganic one, e.g., a silicon-containing compound, oxygen plasma resistance, heat stability, dry-etching resistance, and other properties are largely improved.

EXAMPLES

Hereinafter, the present invention will be described in further detail based on examples, and the examples should by no means be construed as defining the scope of the invention.

Preparation of Photosensitive Resin Composition
1. Photosensitive Resin
(1) Novolak resin (base resin): A novolak resin having a weight average molecular weight of 9,700 obtained by reacting meta-cresol, para-cresol, 3,5-xylenol, and formalin according to a conventional method was used.

(2) Diazonaphthoquinone derivative: A diazonaphthoquinone compound was obtained by reacting a phenol compound shown by the following formula (A):

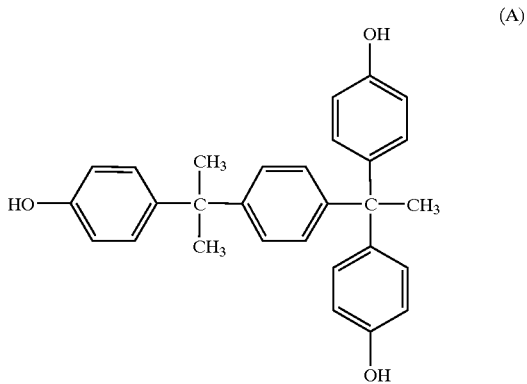

with naphthoquinone-(1,2)-diazido-(2)-5-sulfochloride in a ratio of 1:1.2 (molar ratio) in dioxane using triethylamine as a catalyst.

A positive photoresist comprised of the novolak resin (15 parts by weight), the diazonaphthoquinone compound (7 parts by weight), and propylene glycol monoethyl ether acetate as a solvent (60 parts by weight) was prepared.

2. Active Particle 1.1 g of resorcin, 2.48 g of 3-isocyanatopropyltriethoxysilane, 3.58 µg of a di-n-butyl tin dilaurate (DBTDL) catalyst, 15 g of a propylene glycol monoethyletheracetate (PGMEA) solvent were mixed together and stirred at 55° C. for 3 hours to give a mixture containing a compound in which one of the hydroxyl groups of the resorcin was bonded to the isocyanate group of the 3-isocyanatopropyltriethoxysilane at a concentration of 19.2% by weight. The formation of the compound mentioned above was confirmed by the disappearance of the absorption at 2273 cm$^{-1}$ due to the isocyanate bond measured by the infrared ray absorption spectrum.

7.81 g of the mixture thus obtained, 15 g of silicasol (manufactured by Nissan Kagaku, K.K., NPC (n-propyl cellosolve)silicasol, a solid matter content of silicasol of 30% by weight), and 0.75 g of a 0.05 mol/L hydrochloric acid aqueous solution as a catalyst were stirred at room temperatures for 24 hours to give active particles (silicasol modified by a resorcin unit via a silane coupling agent unit).

Examples 1 to 3

The photosensitive resin and active particles obtained by the preparation method described above were mixed together in a ratio specified in Table 1 (on a solid matter content basis) to give a photosensitive resin composition. The composition thus obtained was examined for the resist properties below.

Comparative Example 1

A photosensitive resin composition was prepared in the same manner as in Example 1 with the exception that the active particles were not used, and its resist properties were evaluated.

Comparative Example 2

A photosensitive resin composition was prepared in the same manner as in Example 1 with the exception that silicasol (manufactured by Nissan Kagaku, K.K., NPC (n-propylcellosolve)silicasol, solid mater content: 30% by weight), and its resist properties were evaluated. [Evaluation of sensitivity, resolution, γ(gamma)-value, heat resistance, and oxygen plasma resistance]

The photosensitive resin composition was coated on a washed silicon wafer by means of a spin coater such that a resist layer of 0.77 μm in thickness after dried was formed, and the wafer was baked on a hot plate at 90° C. for 1 minute. Thereafter, with the amount of exposure changed in steps and through a mask having a line-and-space pattern with different line widths, the resist layer on the wafer was exposed to light using a reduced projection exposing machine (manufactured by Nikon Kabushiki Kaisha, NSR2005i9C, NA=0.57) having an exposing wavelength of 365 nm (i-ray). The wafer was baked at 110° C. on a hot plate for 1 minute. The wafer was paddle-developed with 2.38% by weight of a tetramethylammonium hydroxide solution for 1 minute to give a positive pattern.

The obtained positive pattern was evaluated in the following manner.

Sensitivity: expressed in terms of such an amount of exposed dose to print just as the same size of the mask with a line width of 0.4 μm that the ratio of the width of the line to that of the space becomes 1:1 (the smaller the value is, the higher the sensitivity is).

Resolution: the minimum width of the lines distinctly formed by, without loss of the resist layer, irradiation with such an amount of light that, when the line width of the mask is 0.4 μm, the ratio of the width of the line to that of the space becomes 1:1, measured with a scanning microscope (the smaller the value is, the higher the resolution is).

γ-value: the slope angle θ was measured by plotting the normalized thickness of a resist layer (the thickness of a residual resist layer/the thickness of the initial resist layer) with respect to the logarithm of exposure amount and tan θ was taken as the γ-value (generally, the higher the γ-value, the higher the resolution is).

Heat resistance: the wafers after development were separately placed on hot plates different in temperature for 5 minutes. The temperatures at which the patterns with 500 μm width began to deform were used as indexes of heat resistance (the higher the value is, the higher the heat resistance is).

Oxygen plasma resistance: using a plasma etching device (manufactured by Tokyo Shinku, K.K., SUPER COAT N400), the wafers after development were subjected to oxygen plasma etching under the following conditions.

Feeding system: cathode couple, electrode size: 80 mmØ
Gas: oxygen, pressure: 8.645 Pa, rf electric current applied: 85W
rf electric current density: 1.69 W/cm², treatment time: 5 minutes The film thickness of each wafer after etching was measured. The thickness of the portion of the film lost by etching was divided by the length of etching time to give a value representing the rate of oxygen plasma ($O_2$-RIE rate, nm/sec). The smaller the rate of oxygen plasma is, the higher oxygen plasma resistance the resist has. The results are shown in Table 1.

TABLE 1

| | Solid matter content (weight ratio) | | Sensitivity (mJ/cm²) | Resolution (μm) | γ-value | Heat resistance (° C.) | $O_2$-RIE rate (nm/sec) |
| --- | --- | --- | --- | --- | --- | --- | --- |
| | photosensitive resin | silicasol component | | | | | |
| Ex. 1 | 1 | 0.11 | 240 | 0.30 | 3.6 | 130 | 2.5 |
| Ex. 2 | 1 | 0.25 | 220 | 0.28 | 4.4 | 140 | 0.7 |
| Ex. 3 | 1 | 0.5 | 200 | 0.26 | 5.6 | 150 | 0.2 |
| Comp. Ex. 1 | 1 | 0 | 260 | 0.35 | 1.0 | 110 | 5.0 |
| Comp. Ex. 2 | 1 | 0.5 | 240 | 0.35 | 1.1 | 120 | 0.2 |

As is obvious from Table, compared to the active particle-free resist of Comparative Example 1, the resists of Examples were improved in every aspect. In Example 3, the degree of improvement in γ-value is higher than that in Comparative Example 2 using non-modified silicasol of which the silicasol content is the same as that of the silicasol used in Example 3.

What is claimed is:

1. Active particles useful in combination with a diazonium-series photosensitizer contained in a photosensitive resin, said particles comprising a particulate carrier and an aromatic unit which is indirectly bonded to the carrier via a coupling agent,
    wherein the aromatic unit has a phenolic hydroxyl group and no substituent in at least one of the o-position and p-position in relation to the phenolic hydroxyl group,
    the coupling agent has a group reactive to the particulate carrier, which is a halogen atom or an alkoxy group and a group reactive to a compound having the aromatic unit, which is an isocyanate group, a carboxyl group, an epoxy group, a hydroxyl group or a vinyl group;
    the particulate carrier is an inorganic particulate carrier wherein the mean particle size of the particulate carrier is 1 to 100 nm; and,
    the proportion of the coupling agent is 1 to 20 parts by weight relative to 100 parts by weight of the inorganic particulate carrier.

2. Active particles according to claim 1, which as a result of a reaction with a quinonediazide at non-exposed areas makes a difference in solubility in an alkali between exposed areas and non-exposed areas.

3. Active particles according to claim 1, wherein each of the particulate carriers having a mean particle size of 2 to 100 nm is, via a silane coupling agent, bonded to the aromatic unit having a phenolic hydroxyl group; and the proportion of the coupling agent relative to 100 parts by weight of the particulate carriers is 0.1 to 100 parts by weight.

4. Active particles according to claim 3, wherein the carrier is silicasol.

5. Active particles according to claim 1, wherein the inorganic particulate carrier is a metal selected from gold, silver, copper, platinum or aluminum.

6. Active particles according to claim 1, wherein the inorganic particulate carrier is an inorganic oxide selected from silica, alumina, titania, zirconia, zinc oxide, copper oxide, lead oxide, yttrium oxide, tin oxide, indium oxide or magnesium oxide.

7. Active particles according to claim 1, wherein the inorganic particulate carrier is an iorganic carbonate or magnesium carbonate.

8. Active particles according to claim 1, wherein the inorganic particulate carrier is an inorganic sulfate selected from barium sulfate or calcium sulfate.

9. Active particles according to claim 1, wherein the inorganic particulate carrier is an inorganic phosphate selected from calcium phosphate or magnesium phosphate.

10. Active particles according to claim 1, wherein the compound having the aromatic unit is an aromatic compound having a phenolic hydroxyl group and a group reactive to the coupling agent, which is a hydroxyl group, an amino group, a carboxyl group, an isocyanate group, an epoxy group or a vinyl group.

11. A photosensitive resin composition comprising a base resin, a diazonium-series photosensitizer, and active particles comprising a particulate carrier and an aromatic unit which is indirectly bonded to the carrier via a coupling agent and has a phenolic hydroxyl group and no substituent in at least one of the o-position and p-position in relation to the phenolic hydroxyl group, and the coupling agent has a group reactive to the particulate carrier, which is a halogen atom or an alkoxy group and a group reactive to a compound having the aromatic unit, which is an isocyanate group, a carboxyl group, an epoxy group, an amino group, a hydroxyl group or a vinyl group.

12. A photosensitive resin composition according to claim 11, which is of positive type and developable with water or an alkai.

13. A photosensitive resin composition according to claim 11, wherein the photosensitive resin comprises a novolak-series phenolic resin and a quinonediazide.

14. A process for forming a pattern, which comprises applying a photosensitive resin composition recited in claim 11, on a substrate followed by exposure to light and development.

15. A process according to claim 14, wherein the development is followed by oxygen plasma treatment for etching.

16. A photosensitive resin composition according to claim 11, wherein the mean particle size of the particulate carrier is 1 to 100 nm.

17. A combination of active particles comprising a particulate carrier and an aromatic unit which is indirectly bonded to the carrier via a coupling agent and has a phenolic hydroxyl group and no substituent in at least one of the o-position and p-position in relation to the phenolic hydroxyl group and a diazonium-series photosensitizer, and the coupling agent has a group reactive to the particulate carrier, which is a halogen atom or an alkoxy group and a group reactive to a compound having the aromatic unit, which is an isocyanate group, a carboxyl group, an epoxy group, an amino group, a hydroxyl group or a vinyl group.

18. A combination according to claim 17, wherein the mean particle size of the particulate carrier is 1 to 100 nm.

19. A process for improving at least either sensitivity or resolution by adding active particles comprising a particulate carrier and an aromatic unit which is indirectly bonded to the carrier via a coupling agent and has a phenolic hydroxyl group and no substituent in at least one of the o-position and p-position in relation to the phenolic hydroxyl group to a photosensitive resin comprising a base resin and a diazonium-series photosensitizer, and the coupling agent has a group reactive to the particulate carrier, which is a halogen atom or an alkoxy group and a group reactive to a compound having the aromatic unit, which is an isocyanate group, a carboxyl group, an epoxy group, an amino group, a hydroxyl group or a vinyl group.

20. A process according to claim 19, wherein the mean particle size of the particulate carrier is 1 to 100 nm.

21. Active particles useful in combination with a diazonium-series photosensitizer contained in a photosensitive resin, said particles comprising an inorganic particulate carrier and an aromatic unit which is indirectly bonded to the carrier via a coupling agent, wherein the aromatic unit has a phenolic hydroxyl group and no substituent in at least one of the o-position and p-position in relation to the phenolic hydroxyl group, the coupling agent has a group reactive to the particulate inorganic carrier, which is a halogen atom or an alkoxy group and a group reactive to a compound having the aromatic unit, which is an isocyanate group, a carboxyl group, an epoxy group, an amino group, a hydroxyl group or a vinyl group; and, the inorganic particulate carrier has a mean particle size of from 1 to 100 nm and is a metal, an inorganic carbonate, an inorganic sulfate or an inorganic phosphate.

22. A photosensitive resin composition comprising a base resin, a diazonium-series photosensitizer and the active particles as set forth in claim 21.

23. A combination comprising the active particles according to claim 21 and a diazonium-series photosensitizer.

\* \* \* \* \*